United States Patent [19]

Thiele et al.

[11] Patent Number: 5,423,081
[45] Date of Patent: Jun. 6, 1995

[54] CELLULAR POWER AMPLIFIER POWER LEVEL CONTROL CIRCUITRY

[75] Inventors: Al Thiele; Sai Kwok; Khalid Karimullah, all of San Diego, Calif.

[73] Assignee: Hughes Aircraft Company, Los Angeles, Calif.

[21] Appl. No.: 106,730

[22] Filed: Aug. 16, 1993

[51] Int. Cl.$^6$ ............................................. H04B 1/04
[52] U.S. Cl. .................................. 455/116; 455/126; 330/129; 330/279
[58] Field of Search ............... 455/116, 126, 127, 33.1; 379/59; 330/129, 279

[56] References Cited

U.S. PATENT DOCUMENTS

| | | | |
|---|---|---|---|
| 4,476,437 | 10/1984 | Fujiwara | 330/279 |
| 4,485,349 | 11/1984 | Siegel et al. | 455/126 |
| 4,523,155 | 6/1985 | Walczak et al. | 330/279 |
| 4,952,866 | 8/1990 | Van Tuijl | 323/315 |
| 5,126,686 | 6/1992 | Tam | 455/126 |
| 5,208,550 | 5/1993 | Iwane | 330/129 |
| 5,214,393 | 5/1993 | Aihara | 455/126 |

Primary Examiner—Edward F. Urban
Assistant Examiner—Andrew Faile
Attorney, Agent, or Firm—Gordon R. Lindeen, III; Wanda K. Denson-Low

[57] ABSTRACT

A power level control circuit for the power amplifier of a mobile cellular unit does not require a matched diode pair yet is simple in design. A sampling device, such as a directional coupler or sampling capacitor, connected to an output of the power amplifier provides a sampled RF signal output. An impedance is connected to the sampling device, and the sampling device forms a RF attenuator. A tunnel diode detector is connected to the sampling device for generating a detected d.c. output signal. Power level control (PLC) circuitry compares the detected d.c. output signal from the tunnel diode detector with a selected power level control reference signal and generates a feedback signal to the RF power amplifier to control the power level output from the amplifier. The dynamic range of this basic circuit is increased by switched attenuators, switched parallel detectors with scaled attenuation factors, or a controlled varactor diode used to change the RF coupling to the diode detector.

17 Claims, 9 Drawing Sheets

CELLULAR POWER AMPLIFIER POWER LEVEL CONTROL CIRCUITRY

BACKGROUND OF THE INVENTION

1. Field of the Invention

The present invention generally relates to digital voice communications in a cellular system and, more particularly, to circuitry to control the power level of mobile units in a cellular telephone system. The power level control circuit according to the invention matches the performance of a matched diode pair yet is simpler in design.

2. Description of the Prior Art

The mobile telephone switching office (MTSO), or the base station under the control of the MTSO, sets the power level at which mobile/portable units (hereafter referred to collectively as mobile units) in a cellular telephone system can operate. In addition, most mobile units incorporate some form of closed loop control. Under current EIA standards and applicable regulations, the mobile transmitted power level assignment must be controlled by the MTSO. The MTSO is capable of monitoring the performance of the whole system and can increase or decrease the transmitted power level of the mobile units to render optimum performance. For a more detailed discussion of cellular communications, in general, and, in particular, power level control of the mobile units, the reader is referred to *Mobile Cellular Telecommunications Systems* by William C. Y. Lee, McGraw-Hill Book Co. (1989).

Because of the difficulty of maintaining constant RF power amplifier signal output level across a wide temperature range, variations in supply voltage, input signal level, frequency band and dynamic range, some current cellular telephones have a matched diode pair to temperature compensate power level control circuitry. An example is shown in U.S. Pat. No. 4,523,155 to Walczak et al. which discloses a temperature compensated automatic output control circuitry for power amplifiers which uses matched diode temperature compensation. While the circuitry using a matched diode pair is relatively simple, selecting matched pairs of diodes increases the cost of manufacture.

Other prior art systems use complicated and expensive schemes to avoid the need of temperature compensation. One example is shown in U.S. Pat. No. 4,952,886 to Braathen et al. which discloses an RF power control circuit wherein a sample of the RF output is amplitude modulated, then this signal is demodulated for level control thereby avoiding temperature sensitive direct RF detection. Thus, the problem of selecting matched pairs of diodes is traded for a more complex circuit, with its own contribution to the cost of the unit.

SUMMARY OF THE INVENTION

It is therefore an object of the present invention to provide a power level control circuit for the power amplifier of mobile cellular unit which, on the one hand, does not require a matched diode pair while, on the other hand, is simple in design, resulting in economies of manufacture.

According to the invention, a sampling device, such as a directional coupler or a sampling capacitor, is connected to an output of the power amplifier to provide a sampled RF signal output. Preferably, a directional coupler is used with a coupling coefficient k to avoid load impedance variation without an isolator. In the case of a directional coupler, one port of the coupler is terminated in a characteristic impedance and the terminated coupler effectively acts as an attenuator having an attenuation factor of 1/k, where k is the coupling coefficient of the directional coupler. Where the coupling device is a sampling capacitor, a resistor is connected to the sampling capacitor to form a RF attenuator. The resistor may be a circuit resistance rather than a separate circuit element. The RF attenuator in this case has an attenuation factor $$\alpha = \frac{1}{\omega RC},$$

where $\omega$ is the angular frequency of the sampled RF signal, R is the resistance of the resistor and C is the capacitance of the sampling capacitor. A tunnel diode detector is connected to the junction of the sampling capacitor and the resistor for generating a detected d.c. output signal. Power level control (PLC) circuitry compares the detected d.c. output signal from the tunnel diode detector with a selected power level control reference signal and generates a feedback signal to the RF power amplifier to control the power level output from the amplifier. The dynamic range of this basic circuit is increased by switched attenuators or switched parallel detectors with scaled attenuation factors.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
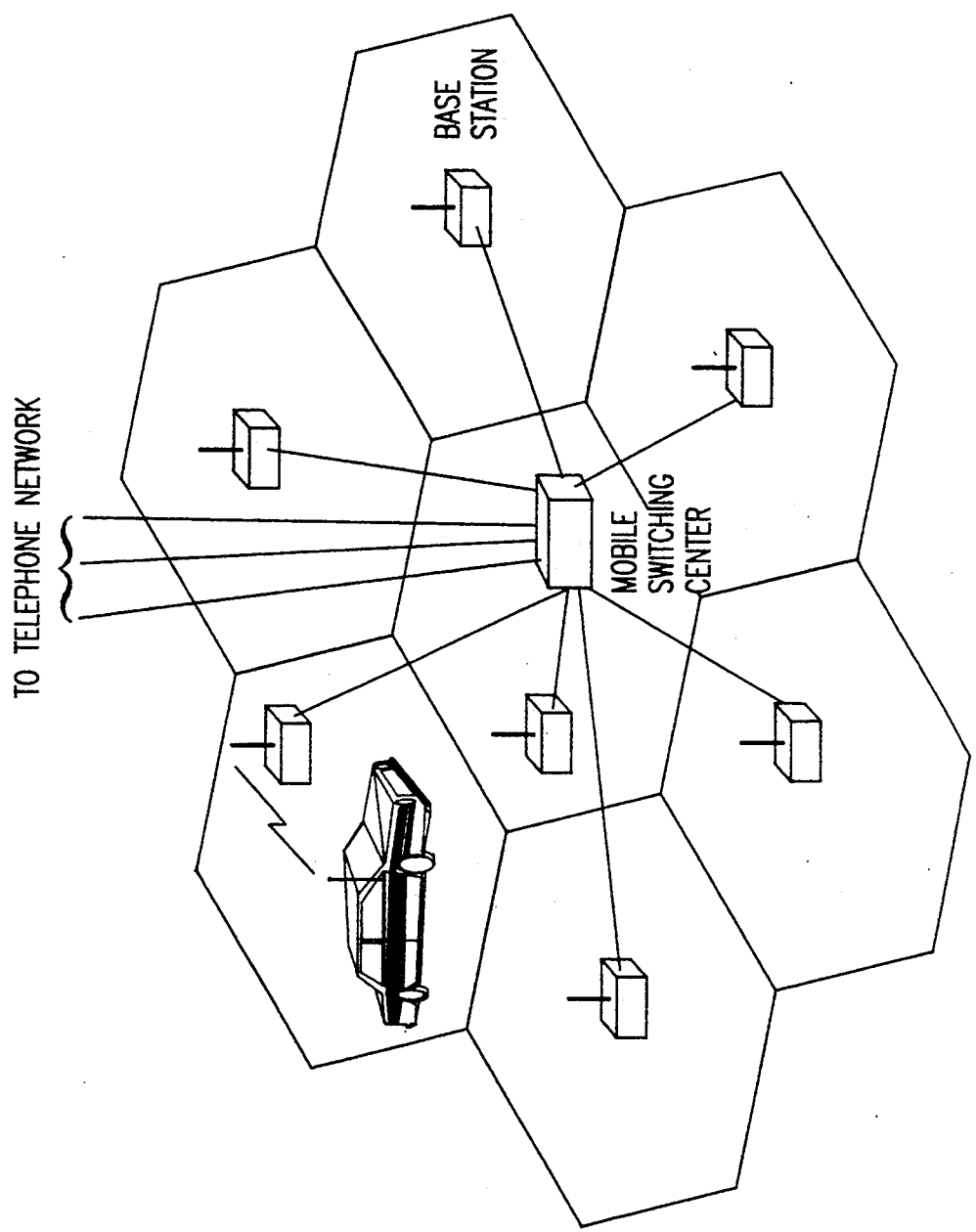
FIG. 1 is a pictorial diagram showing a typical mobile cellular communication system.

Referring now to the drawings, and more particularly to FIG. 1, there is shown a typical mobile cellular communication system which is the environment in which the subject invention is practiced. Each cell is represented as a hexagon and has within its boundaries a base station. The several base stations are connected to a Mobile Telephone Switching Office (MTSO) which provides the interface to the local telephone company central office. A subscriber or mobile unit, here represented as being installed in an automobile, communicates with the base station within the cell where that unit is currently located. As the subscriber unit moves from one cell to another, it is handed-off to the base stations of each successive cell that the subscriber unit traverses. This arrangement and the general operation is well known in the art, and for further background on the subject, the reader is referred to the text book by William C. Y. Lee, supra.

To maximize the overall cellular system efficiency, the mobile radio must be able to adjust its RF output level to one of eight preset levels as instructed by its "locked in" cell base station according to the distance between the base station and the mobile unit. The eight levels are designated PL0 to PL7, from highest level to lowest level. The EIA standards require a 28 dB range. Given a fixed control input signal at open loop condition, the overall gain of amplifier varies greatly with frequency, input signal level, supply voltage variation and temperature. Most cellular radio RF power level control circuitry are of closed loop type because of the tight tolerances required by the EIA cellular standards.

Figure 2:
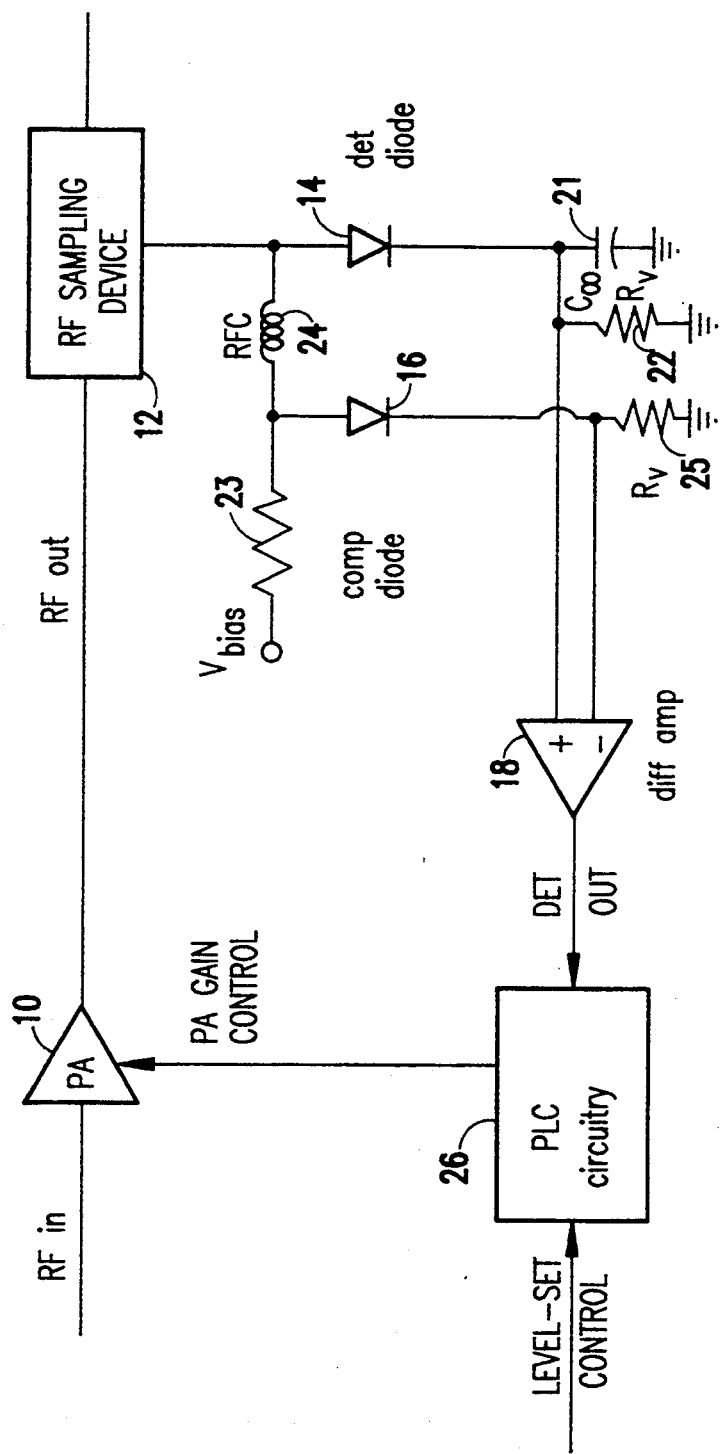
FIG. 2 is block diagram of typical closed loop RF power level control circuitry.

FIG. 2 shows a typical closed loop RF power level control circuitry. The power amplifier 10 provides RF power out which is sampled by directional coupler 12. Two diodes, a detector diode 14 and a compensator diode 16, are used to generate signals to the differential amplifier 18. The detector diode 14 and the compensator diode 16 may be Schottky diodes, for example, and typically are in the same package for better temperature tracking. The detector diode 14 is used to detect the output power, $P_0$, of the power amplifier 10.

More particularly, the anode of detector diode 14 is connected to sampling capacitor 12, and the cathode of detector diode 14 is connected to a parallel RC circuit comprising a capacitor 21 and a load resistor 22. The capacitor 21 serves to hold a peak voltage in the detection process. The cathode of detector diode 14 is also connected to the non-inverting input of differential amplifier 18. The anode of compensator diode 16 is connected by resistor 23 to a source of bias voltage. Bias voltage is also supplied to the anode of detector diode 14 by means of RF choke 24, which provides RF isolation yet maintains equal d.c. bias between the two diodes. The cathode of compensator diode 16 is connected to a second load resistor 25 and also to the inverting input of the differential amplifier 25. The output of differential amplifier 18 is supplied as one input to power level control (PLC) circuitry 26, which receives as a second input a level-set control, a reference level set by a host central processing unit (CPU). The PLC circuitry 26 generates a gain control signal that is proportional to the reference and detected signals and controls the gain of RF power amplifier 10.

The Schottky diode 14 detects the output power, $P_0$, of the power amplifier 10 over a dynamic range of 28 dB or more. At the lowest power output levels, e.g., at PL7 where $P_0 \sim 5$ to 10 mW, the temperature coefficient of the diode produces a temperature-dependent error voltage which may exceed the detected RF signal, causing the PLC circuitry 26 to adjust $P_0$ to a level which exceeds specified limits. This problem is typically solved by adding the compensator diode 16 (matched to the detector diode 14) to temperature compensate the detector output. However, most diode detection circuits are non-linear and have a limited dynamic range between the saturation and threshold points and exhibit non-linear temperature characteristics, so some means is need to extend their ranges for optimum RF detection by changing the RF coupling.

Figure 3:
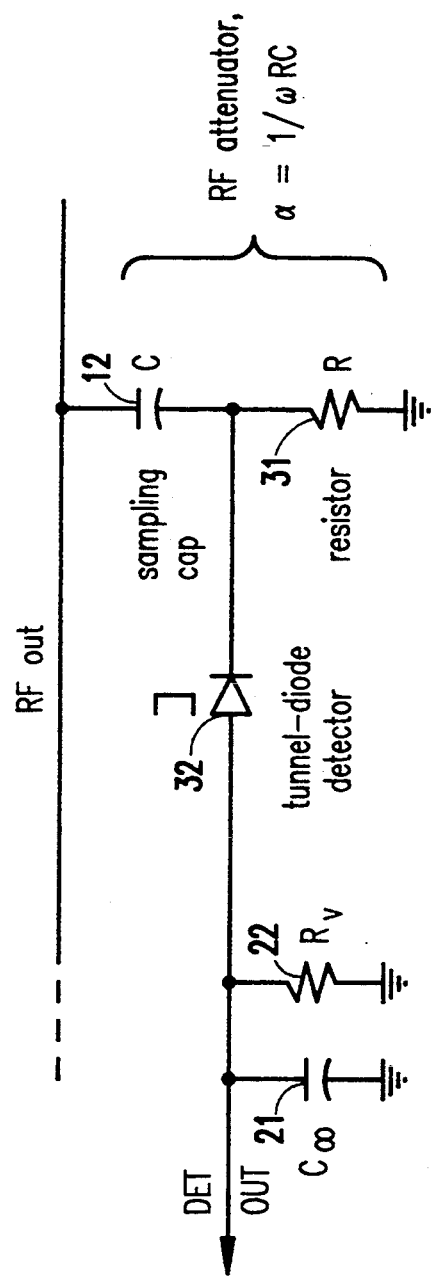
FIG. 3 is a schematic diagram of the power level control circuitry according to a first embodiment of the invention.

The subject invention eliminates the need for the compensator diode 16. In the first embodiment, the invention uses a tunnel diode (a.k.a. back diode) detector, as shown in FIG. 3. In this embodiment, a sampling capacitor 12' is directly connected to a resistor 31 to form an RF attenuator, where $$\alpha = \frac{1}{\omega RC}.$$

The junction of capacitor 12' and resistor 31 are connected to the cathode of tunnel diode 32. The temperature coefficient of a tunnel diode detector is much lower than that of a Schottky or junction diode detector, thus obviating the need for the compensator diode. The anode of the tunnel diode 32 is connected to the capacitor 21 and load resistor 22, connected in shunt. The anode of the tunnel diode is also directly connected as the detector output to PLC circuitry 26, thus also eliminating the differential amplifier 18. The detector output voltage will typically range from a few millivolts at PL7 to a few hundred millivolts at PL0. It will be understood by those skilled in the art that a directional coupler can be substituted for the sampling capacitor 12', and the resistor 31 may be a circuit resistance, such as the internal resistance of the diode 32, rather than a separate circuit element.

Figure 4:
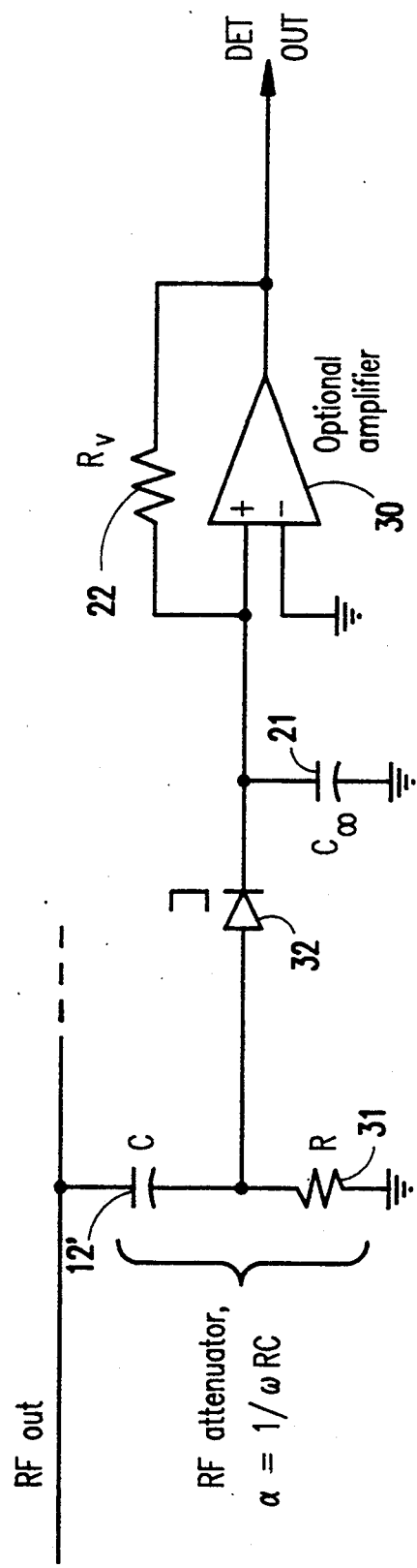
FIG. 4 is a schematic diagram of a modification of the power level control circuitry according to the first embodiment of the invention but employing current-mode operation.

FIG. 4 shows a modification to the first embodiment of the invention shown in FIG. 3. More particularly, in the basic voltage-mode tunnel diode detector of FIG. 3, the detector output voltage develops across the load/video resistance 22 ($R_V$). At high signal levels, this voltage self-biases the tunnel diode 32, limiting the dynamic range of square-law operation. This particular limitation on dynamic range (i.e., self-biasing) may be eliminated by the addition of an inverting operational amplifier 30 shown in FIG. 4. The output electrode of the tunnel diode 32 (i.e., the cathode for the polarity shown in FIG. 4) is maintained at virtual ground (zero d.c. volts), while the detector output voltage develops across resistor 22. Self-biasing is essentially eliminated. The minor amount of self-bias developed across resistor 31 (typically $R << R_V$) may be eliminated by the addition of an RF choke in parallel with resistor 31.

Figure 5:
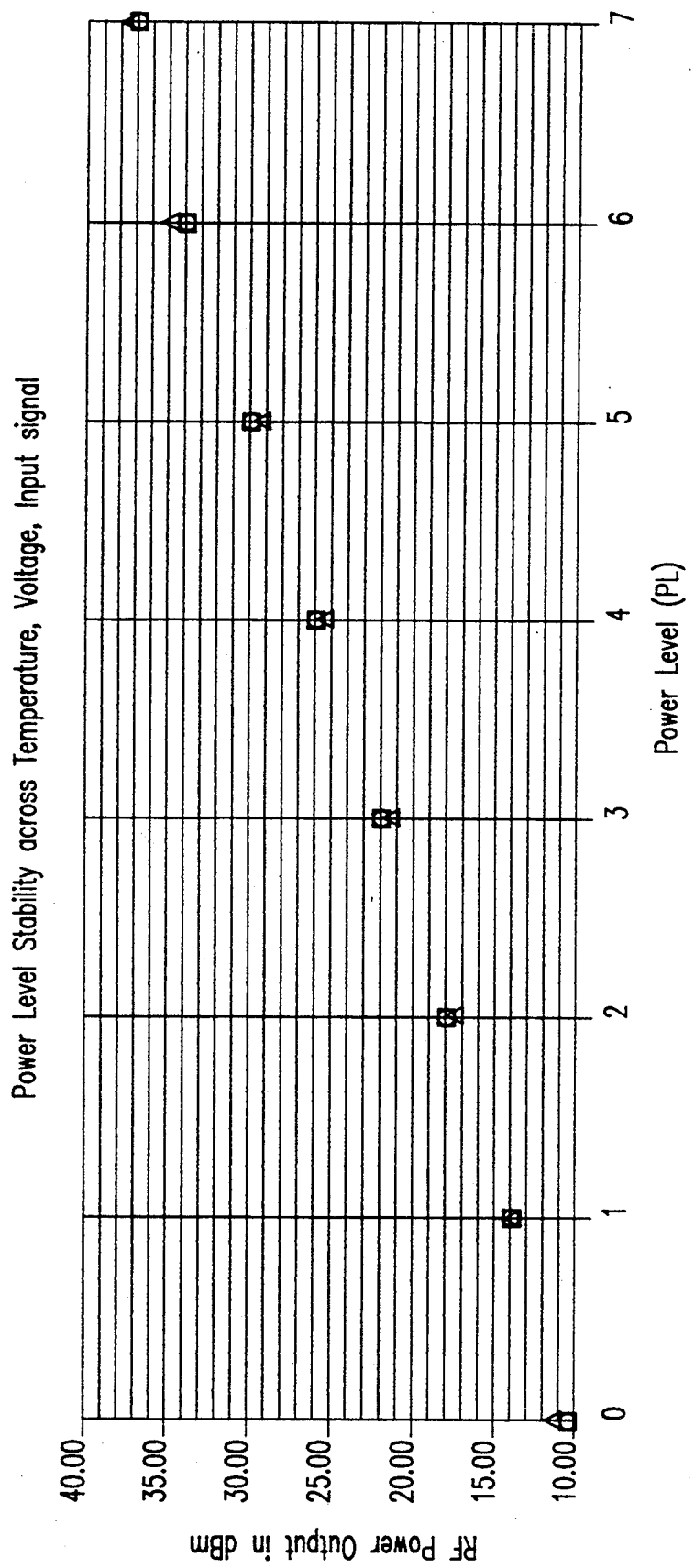
FIG. 5 is a graph showing power level stability test results of the circuitry shown in FIG. 3.

The circuit shown in FIG. 3 was tested (together with a representative power amplifier and uncompensated control circuit) across a temperature range of $-30°$ C. to $+60°$ C., a supply voltage range of 11 V to 16 V, and an input signal level of 1 dBm±2 dB. A power level stability of 1 dB or better was achieved at each output power-level setting (PL0 through PL7), as demonstrated by the data plotted in the graph of FIG. 5. This compares favorably with similar circuitry with fixed coupling and temperature compensated Schottky diode which yielded 3 dB stability.

Figure 6:
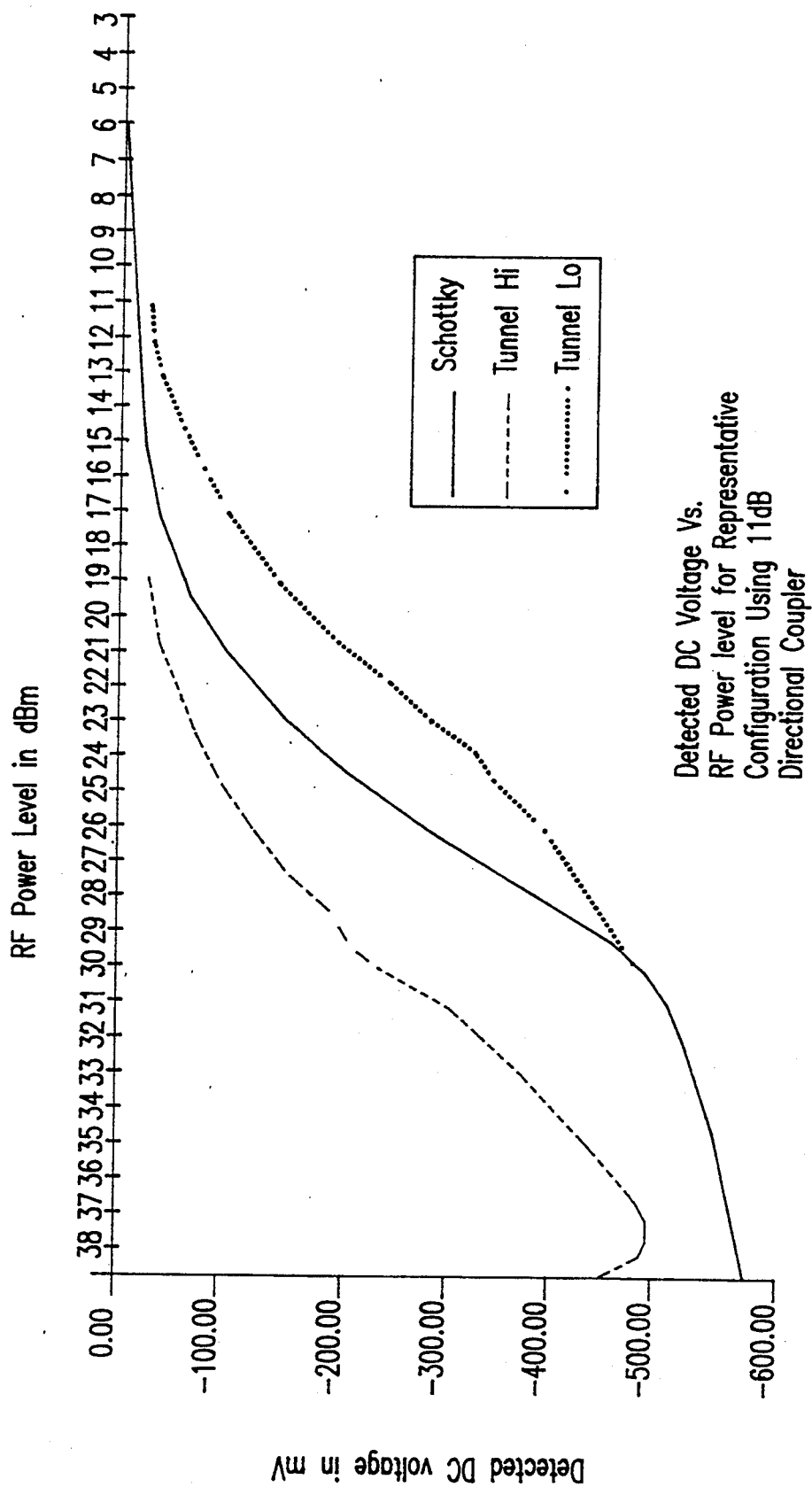
FIG. 6 is a graph showing representative tunnel diode and Schottky diode RF detection characteristics.

The tunnel diode has more linear detection characteristics, and its $\Delta DC/\Delta RF$ slope at low level is higher, as shown in FIG. 6. The two tunnel diode curves shown ("Hi" and "Lo") represent two degrees of coupling (differing by 9 dB), effected via the fourth embodiment of this invention, illustrated in FIG. 9 and described hereinbelow. Circuit constraints may limit a tunnel diode detector's usable dynamic range to less than the 28 dB EIA requirement. Dynamic range may be improved by the current-mode modification of FIG. 4 or, more dramatically, by the use of variable coupling as disclosed in the second, third and fourth embodiments of this invention.

Figure 7:
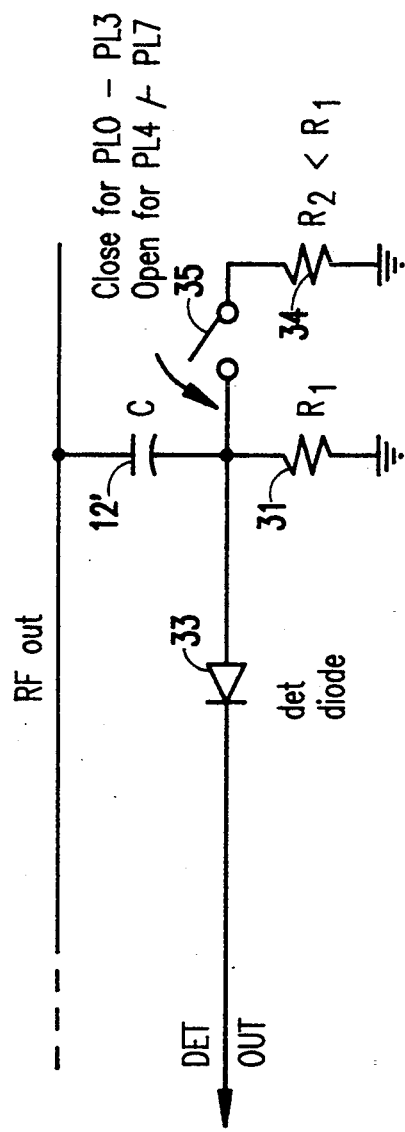
FIG. 7 is a schematic diagram of the power level control circuitry according to a second embodiment of the invention employing a switched attenuator.

In the second embodiment, shown in FIG. 7, this problem is solved by using selectable RF attenuation preceding the detector. As in FIG. 3, the sampling capacitor 12' is connected to resistor 31 forming an RF attenuator. Again, a directional coupler may be substituted for the sampling capacitor 12'. This embodiment may be combined with the tunnel diode 32 detector of the first embodiment. Alternatively, in this embodiment, a Schottky or junction diode 33 may be used, and for the polarity shown in FIG. 7, the detector has its anode connected to the junction of capacitor 12 and resistor 31. A second resistor 34 is connected in parallel with resistor 31 by means of a switch 35. The switch 35 is closed for power levels PL0 to PL3 and open for power levels PL4 to PL7.

If, for example, the resistance value $R_1$ of resistor 31 is equal to four times the resistance value $R_2$ of resistor 34, then attenuation changes by 5-to-1 (14 dB) when the switch 35 is actuated (e.g., in response to a level-set control signal). Accordingly, with properly chosen circuit element values in the cellular radio design, the detector diode 33 will "see" only a 14 dB range of RF level, rather than the 28 dB range "seen" in the conventional design shown in FIG. 2. Hence, for a square-law detector, the minimum detector output voltage may be increased by a factor of up to 25 at the minimum output power level (PL7). For a tunnel diode detector, this would permit relaxed stability requirements on components, such as d.c. amplifiers, within the PLC circuitry 26 connected to the detector output. For a Schottky diode detector, it would permit elimination of the matched compensator diode.

Figure 8:
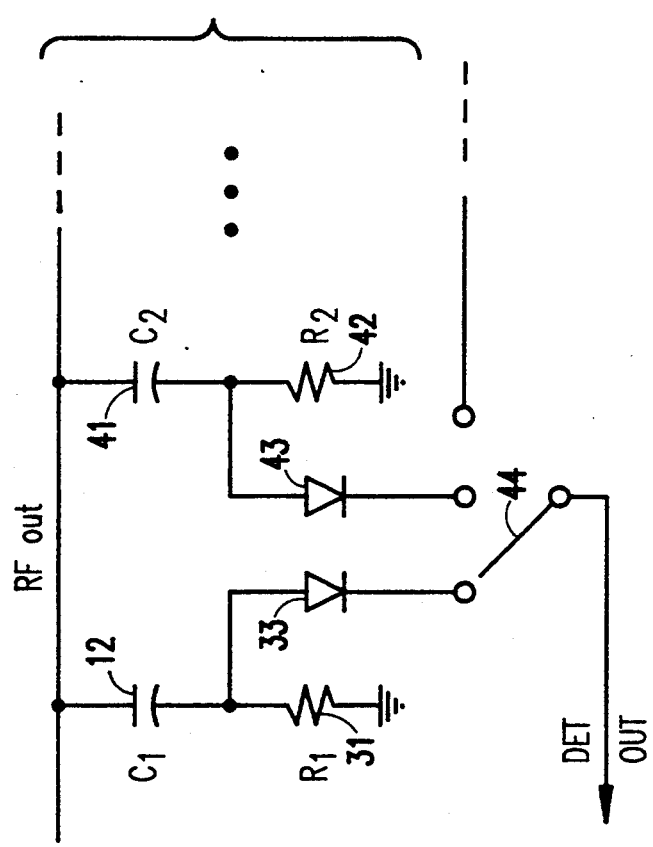
FIG. 8 is a schematic diagram of the power level control circuitry according to a third embodiment of the invention employing switched diode attenuator pairs.

In the third embodiment, shown in FIG. 8, parallel detectors with scaled attenuation factors are used. As in FIG. 3, sampling capacitor 12' (or directional coupler) and resistor 31 are connected to the anode of diode 33. A second sampling capacitor 41 (or directional coupler) and resistor 42 are connected to the anode of diode 43. The capacitor 41 and the resistor 42 form a second RF attenuator. The circuit may be generalized to include N parallel attenuator/detector assemblies with scaled attenuation factors $$\alpha_n = \frac{1}{\omega R_n C_n},$$

such that the dynamic range of the detector output voltage is reduced by 1/N dB relative to that resulting from use of a single detector. The detector output is selected by means of a switch 44.

The embodiment shown in FIG. 8 permits a higher minimum detector output voltage as in the embodiment shown in FIG. 7, but the embodiment shown in FIG. 8 simplifies switching since switching is done at d.c. rather than RF.

Figure 9:
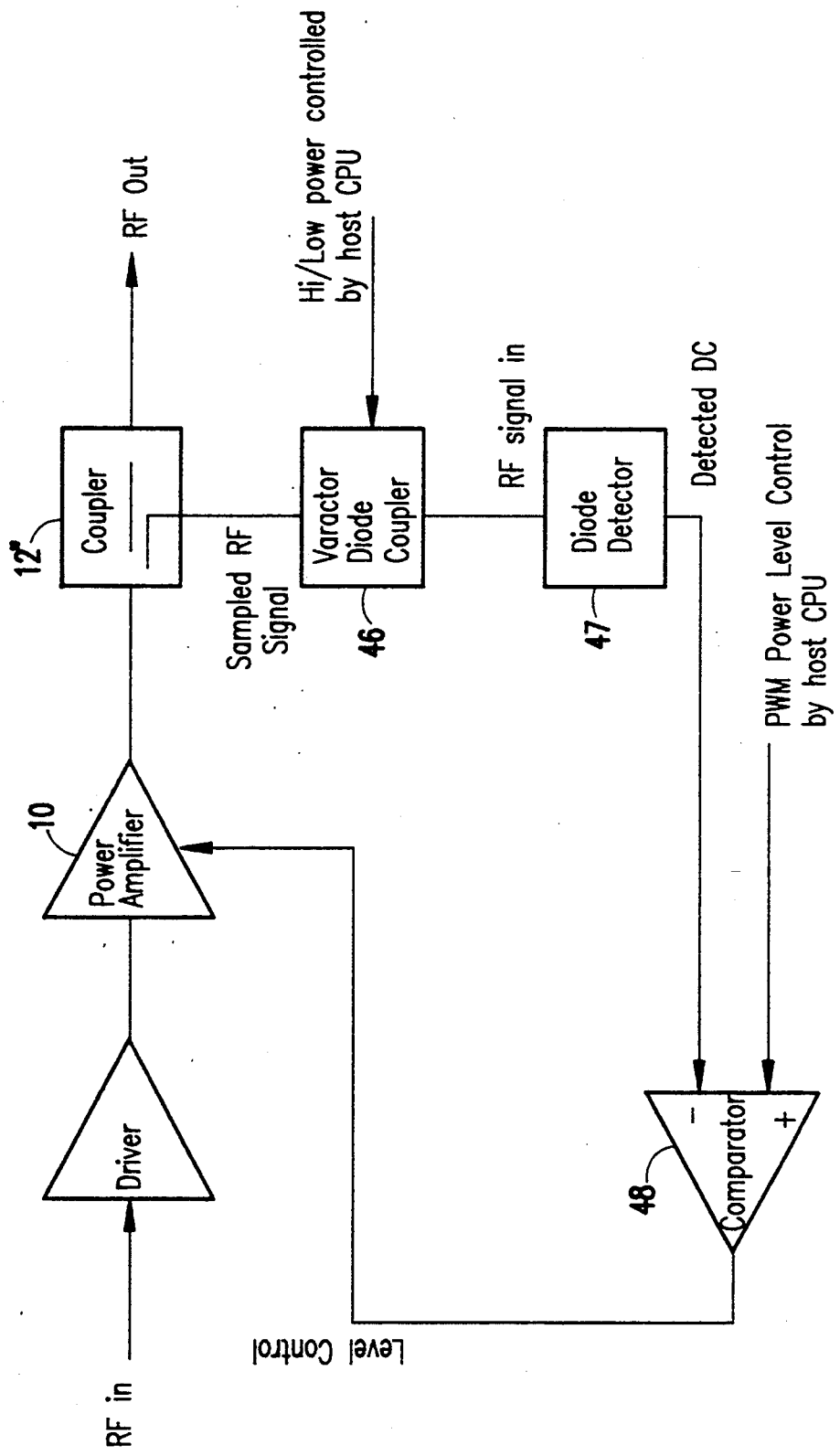
FIG. 9 is a block diagram of the power level control circuitry according to a fourth embodiment of the invention employing a switched varactor diode.

FIG. 9 shows a fourth embodiment of the invention wherein a directional coupler 12" samples the output of the power amplifier 10 and supplies a sampled RF signal to a varactor diode coupler 46. The varactor diode is used to extend the range of the diode detector 47 by changing the RF coupling to the detector. Only two coupling levels (Hi/Low) are needed for tunnel diode detection. More levels can be used to further stabilize other types of diode detection. The diode detector 47 takes the sampled RF signal from the varactor diode coupler 46 and converts this signal into a d.c. level corresponding to the RF output signal strength. A comparator 48 is used to compare the detected level which indicates the RF signal strength and the desired output level as controlled by the host CPU. IT is configured to provide a negative feedback to control the gain of the class C power amplifier 10 corresponding to the desired power level.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A temperature compensating power level control circuit for a radio frequency (RF) power amplifier of a radio transceiver system comprising:
    sampling means connected to an output of said power amplifier for providing a sampled RF signal output;
    impedance means connected to said sampling means forming a RF attenuator having an attenuation factor $\alpha$;
    a tunnel diode detector connected to a junction of said sampling means and said impedance means for generating a detected d.c. output signal, said tunnel diode detector having a temperature coefficient selected to render any error voltage produced by said tunnel diode detector to be less than said d.c. output signal; and
    power level control (PLC) circuitry for comparing said detected d.c. output signal from said tunnel diode detector with a selected power level control reference signal and generating a feedback signal to said amplifier to control the power level output from said amplifier.

2. The power level control circuit recited in claim 1 further comprising an inverting operational amplifier means connected between said tunnel diode detector and said PLC circuitry, said inverting operational amplifier preventing self-biasing of said tunnel diode.

3. The power level control circuit recited in claim 1 further comprising a varactor diode coupler between said sampling means and said tunnel diode detector, said varactor diode coupler being responsive to a control signal to change an RF coupling from said sampling means to said tunnel diode detector.

4. The power level control circuit recited in claim 1 wherein said sampling means is a directional coupler, said impedance means is a characteristic impedance terminating one port of the directional coupler, and said attenuation factor $\alpha = 1/k$, where k is a coupling coefficient of said directional coupler.

5. The power level control circuit recited in claim 1 wherein said sampling means is a sampling capacitor, said impedance means is a resistance means connected in series with said sampling capacitor, and said attenuation factor $$\alpha = \frac{1}{\omega RC},$$

where ω is the angular frequency of the sampled RF signal, R is the resistance of said resistance means and C is the capacitance of said sampling capacitor.

6. The power level control circuit recited in claim 1 wherein said impedance means is a first resistance means, further comprising second resistance means and a switch, said switch being operative to connect said second resistance means in parallel with said first resistance means to change said attenuation factor α.

7. The power level control circuit recited in claim 6 wherein said second resistance means has a resistance value less than said first resistance means.

8. The power level control circuit recited in claim 7 wherein said first resistance means has a resistance value N times the resistance value of said second resistance means so that said attenuation factor α changes by N+1 to 1 when said switch is actuated.

9. The power level control circuit recited in claim 1 further comprising:
   second sampling means connected to an output of said power amplifier and providing a second sampled RF signal output;
   second impedance means connected to said second sampling means forming an RF attenuator having an attenuation factor $\alpha_2$;
   a second tunnel diode detector connected to a junction of said second sampling means and said second impedance means for generating a second detected d.c. output signal; and
   a selector switch connected to said first mentioned tunnel diode detector and said second tunnel diode detector for selecting one of said detected d.c. output signals as a detector output.

10. The power level control circuit recited in claim 9 wherein said first mentioned sampling means is a first sampling capacitor, said first mentioned impedance means is a first resistance means connected in series with said first sampling capacitor, said second sampling means is a second sampling capacitor, and said second impedance means is a second resistance means connected in series with said second sampling capacitor, said attenuation factor $$\alpha = \frac{1}{\omega R_1 C_1},$$

where ω is the angular frequency of the sampled RF signal, $R_1$ is the resistance of said first mentioned resistance means and $C_1$ is the capacitance of said first sampling capacitor and said attenuation factor $$\alpha_2 = \frac{1}{\omega R_2 C_2},$$

$R_2$ is the resistance of said second resistance means and $C_2$ is the capacitance of said second sampling capacitor.

11. The power level control circuit recited in claim 1 further comprising:
   a plurality of sampling means connected to an output of said power amplifier and providing a plurality of sampled RF signal outputs;
   a plurality of impedance means each connected to one of said plurality of sampling means forming a plurality of RF attenuators having an attenuation factors $\alpha_i$, i=1, ..., n, where n is the number of said sampling means;
   a plurality of tunnel diode detectors connected to a corresponding one of said sampling means for generating a plurality detected d.c. output signal; and
   a selector switch connected to said plurality of tunnel diode detectors for selecting one of said plurality of detected d.c. output signals as a detector output.

12. A power level control circuit for a radio frequency (RF) power amplifier of a radio transceiver system comprising:
   first sampling means connected to an output of said power amplifier and providing a sampled RF signal output;
   a first resistor connected to said first sampling means forming a first RF attenuator having an attenuation factor $\alpha_1$;
   a first diode detector connected to said first sampling means and for generating a first detected d.c. output signal;
   second sampling means connected to an output of said power amplifier and providing a second sampled RF signal output;
   a second resistor connected to said second sampling means forming a second RF attenuator having an attenuation factor $\alpha_2$;
   a second diode detector connected to said second sampling means for generating a second detected d.c. output signal;
   a selector switch connected to said first diode detector and to said second diode detector for selecting one of said detected d.c. output signals as a detector output; and
   power level control (PLC) circuitry for comparing said detector output with a selected power level control reference signal and generating a feedback signal to said amplifier to control the power level output from said amplifier.

13. The power level control circuit as recited in claim 12 wherein said first and second diode detectors are Schottky diodes.

14. The power level control circuit as recited in claim 12 wherein said first and second diode detectors are tunnel diodes.

15. A power level control circuit for a radio frequency (RF) power amplifier of a radio transceiver system comprising:
   a plurality of sampling means connected to an output of said power amplifier and providing a plurality of sampled RF signal outputs;
   a plurality of resistors each connected to a corresponding one of said sampling means forming a plurality of RF attenuators having attenuation factors $\alpha_i$, i=0, ..., n, where n is the number of sampling means;
   a plurality of diode detectors each connected to a corresponding one of a sampling means for generating a plurality of detected d.c. output signals;
   a selector switch connected to said plurality of diode detectors and for selecting one of said detected d.c. output signals as a detector output; and
   power level control (PLC) circuitry for comparing said detector output with a selected power level control reference signal and generating a feedback signal to said amplifier to control the power level output from said amplifier.

16. The power level control circuit as recited in claim 15 wherein said plurality of diode detectors are Schottky diodes.

17. The power level control circuit as recited in claim 15 wherein said plurality of diode detectors are tunnel diodes.

* * * * *